US010269658B2

(12) United States Patent
Huang et al.

(10) Patent No.: US 10,269,658 B2
(45) Date of Patent: Apr. 23, 2019

(54) INTEGRATED CIRCUIT DEVICES WITH WELL REGIONS AND METHODS FOR FORMING THE SAME

(75) Inventors: Chi-Feng Huang, Zhubei (TW); Chia-Chung Chen, Keelung (TW); Victor Chiang Liang, Hsin-Chu (TW); Mingo Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 620 days.

(21) Appl. No.: 13/539,027

(22) Filed: Jun. 29, 2012

(65) Prior Publication Data

US 2014/0001518 A1    Jan. 2, 2014

(51) Int. Cl.
| H01L 27/07 | (2006.01) |
| H01L 21/8249 | (2006.01) |
| H01L 27/06 | (2006.01) |
| H01L 27/085 | (2006.01) |
| H01L 29/732 | (2006.01) |

(Continued)

(52) U.S. Cl.
CPC ...... *H01L 21/8249* (2013.01); *H01L 27/0623* (2013.01); *H01L 27/085* (2013.01); *H01L 29/732* (2013.01); *H01L 29/7327* (2013.01); *H01L 29/808* (2013.01); *H01L 29/861* (2013.01); *H01L 29/93* (2013.01); *H01L 27/07* (2013.01); *H01L 29/0649* (2013.01); *H01L 29/0653* (2013.01); *H01L 29/0692* (2013.01)

(58) Field of Classification Search
CPC ............................ H01L 27/07; H01L 21/8249

USPC .... 257/270, E21.696, E27.03; 438/195, 190, 438/189
See application file for complete search history.

(56) References Cited

U.S. PATENT DOCUMENTS

| 5,943,595 A | 8/1999 | Akiyama et al. |
| 7,969,243 B2 | 6/2011 | Bracale et al. |

(Continued)

FOREIGN PATENT DOCUMENTS

TW            I1247362 B        1/2006

OTHER PUBLICATIONS

Hanafi, Bassel, et al., "A Technique for Truly Linear LC VCO Tuning, a Proof of Concept," IEEE International Conference on Microelectronics, Dec. 29-31, 2007, pp. 93-96.

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method includes forming a deep well region of a first conductivity type in a substrate, implanting a portion of the deep well region to form a first gate, and implanting the deep well region to form a well region. The well region and the first gate are of a second conductivity type opposite the first conductivity type. An implantation is performed to form a channel region of the first conductivity type over the first gate. A portion of the deep well region overlying the channel region is implanted to form a second gate of the second conductivity type. A source/drain implantation is performed to form a source region and a drain region of the first conductivity type on opposite sides of the second gate. The source and drain regions are connected to the channel region, and overlap the channel region and the first gate.

20 Claims, 21 Drawing Sheets

(51) Int. Cl.
*H01L 29/808* (2006.01)
*H01L 29/861* (2006.01)
*H01L 29/93* (2006.01)
*H01L 29/06* (2006.01)

(56) References Cited

U.S. PATENT DOCUMENTS

| | | | |
|---|---|---|---|
| 2007/0069250 A1* | 3/2007 | Chen et al. | 257/256 |
| 2008/0029830 A1 | 2/2008 | Tsai et al. | |
| 2008/0079023 A1* | 4/2008 | Hikita et al. | 257/192 |
| 2008/0230812 A1* | 9/2008 | Disney et al. | 257/272 |
| 2008/0315266 A1* | 12/2008 | Eshun et al. | 257/285 |
| 2010/0207173 A1* | 8/2010 | Anderson et al. | 257/270 |
| 2010/0213544 A1 | 8/2010 | Liu et al. | |
| 2012/0168820 A1* | 7/2012 | Liu et al. | 257/192 |
| 2012/0217513 A1* | 8/2012 | Tega | H01L 29/45 257/77 |
| 2012/0292669 A1* | 11/2012 | Candra et al. | 257/268 |

OTHER PUBLICATIONS

Hatfield, Christopher W., et al., "DC I-V Characteristics and RF Performance of a 4H—SiC JFET at 773 K," IEEE Transactions on Electron Devices, vol. 45, No. 9, Sep. 1998, pp. 2072-2074.

Kim, Jongsik, et al., "A Wide-Band CMOS LC VCO With Linearized Coarse Tuning Characteristics," IEEE Transactions on Circuits and Systems-II: Express Briefs, vol. 55, No. 5, May 2008, pp. 399-403.

Kurachi, Satoshi, et al., "5-GHz Band Highly Linear VCO IC with a Novel Resonant Circuit," Topical Meeting on Silicon Monolithic Integrated Circuits in RF Systems, 2007, pp. 285-288.

Ohgihara, Takahiro, et al., "GaAs JFET Front-End MMICs for L-Band Personal Communications," IEEE Microwave and Millimeter-Wave Monolithic Circuits Symposium, 1993, pp. 9-12.

Shi, Yun, et al., "A Cost-Competitive High Performance Junction-FET (JFET) in CMOS Process for RF & Analog Applications," IEEE Radio Frequency Integrated Circuits Symposium, 2010, pp. 237-240.

\* cited by examiner

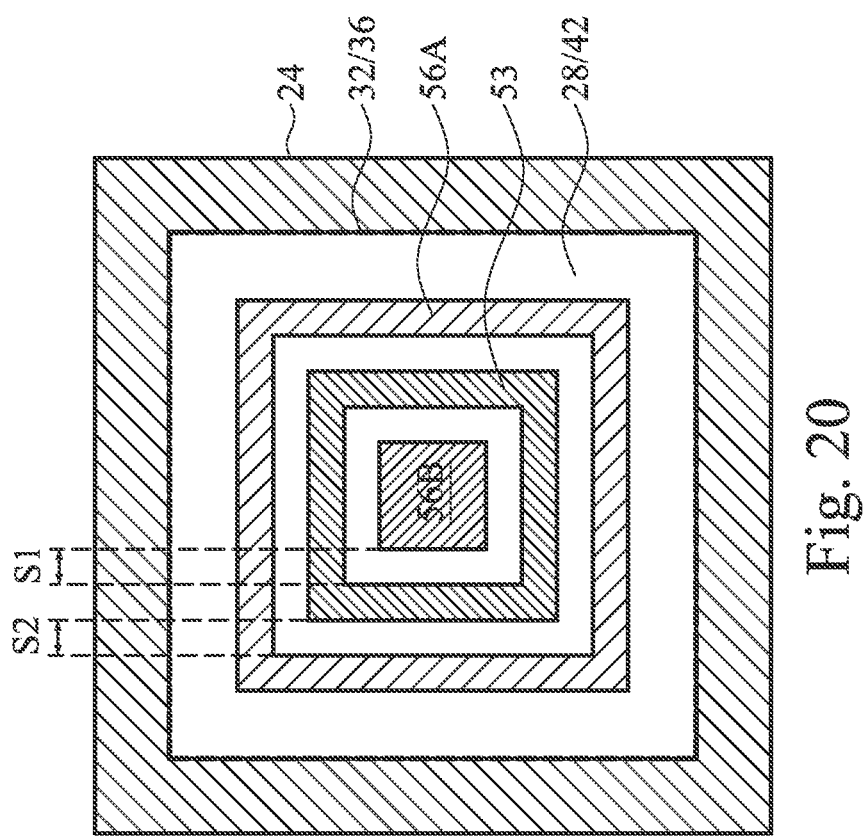

INTEGRATED CIRCUIT DEVICES WITH WELL REGIONS AND METHODS FOR FORMING THE SAME

BACKGROUND

Integrated circuits include Metal-Oxide-Semiconductor (MOS) devices, diodes, capacitors, varactors, resistors, and the like. The formation processes of these devices need to be integrated, so that they can be formed in the same semiconductor chips.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 16 through 23 illustrate various layouts in accordance with exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An integrated circuit structure that may be used for forming varying devices and the method of forming the same are provided in accordance with exemplary embodiments. The intermediate stages of forming the integrated circuit structure are illustrated. The variations of the embodiments are discussed. Throughout various views and illustrative embodiments, like reference numbers are used to designate like elements. Although the illustrated exemplary embodiments provide the methods of forming the integrated circuit structure having p-type bottom and top gates and an n-type channel, one of ordinary skill in the art will realize that the teaching is readily available for the formation of n-type bottom and top gates and a p-type channel, with the conductivity types of the respective doped semiconductor regions inverted.

Figure 1:
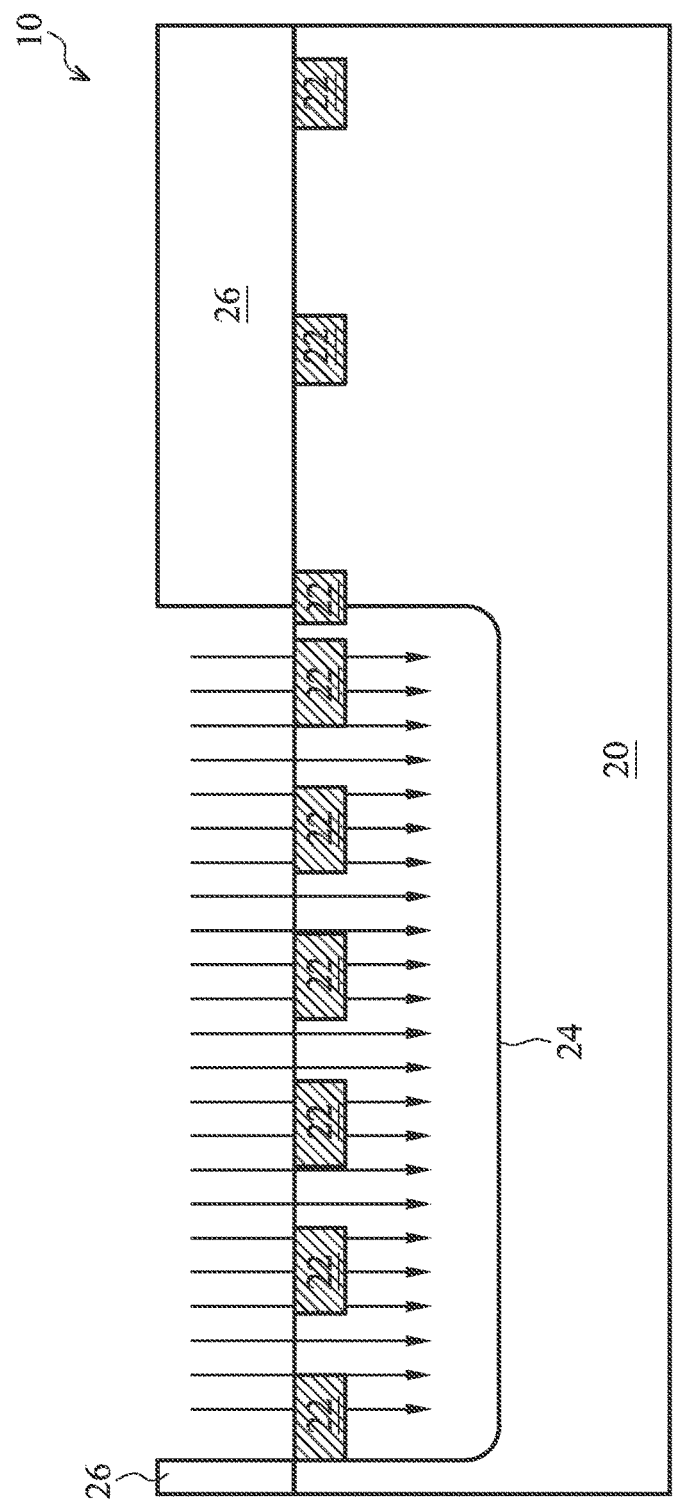
FIGS. 1 through 10 are cross-sectional views of intermediate stages in the manufacturing of an integrated circuit structure in accordance with some exemplary embodiments.

FIG. 1 illustrates the formation of isolation regions 22 at the top surface of substrate 20, which may be a part of wafer 10. Substrate 20 is a semiconductor substrate, which may be a silicon substrate, although other semiconductor materials such as germanium, silicon germanium, III-V compound semiconductor materials, or the like, may be used. Isolation regions 22 may be Shallow Trench Isolation (STI) regions, and hence are referred to STI regions 22 throughout the description, although isolation regions 22 may also be of other types such as field oxides. Deep n-well region 24 is formed in substrate 20. In some embodiments, the formation of deep n-well region 24 includes forming photo resist 26, and implanting an n-type impurity such as phosphorous, indium, or the like into substrate 20. Photo resist 26 is then removed. The bottom surface of deep n-well region 24 is lower than the bottom surface of STI regions 22. An exemplary impurity concentration in deep n-well region 24 is between about $1E13/cm^3$ and about $1E15/cm^3$.

Figure 2:
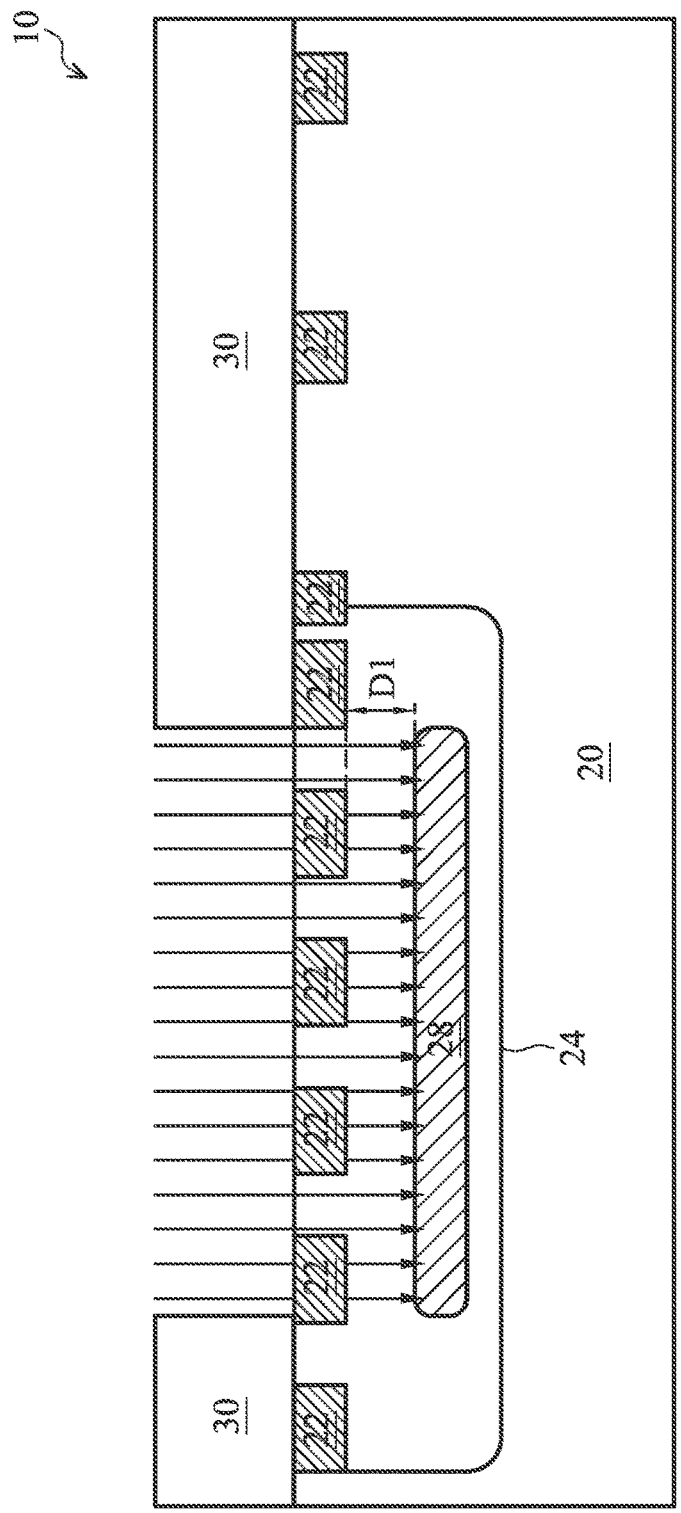

Referring to FIG. 2, buried well region 28, which may be of p-type, is formed. Throughout the description, buried well region 28 is alternatively referred to as bottom gate 28 since it may act as a bottom gate of the resulting Field-Effect Transistor (FET) device in some exemplary embodiments. The formation includes forming and patterning photo resist 30, and implanting a p-type impurity into an intermediate level of deep n-well region 24. Photo resist 30 is then removed. In some embodiments, bottom gate 28 is spaced apart from the bottoms of STI regions 22 by distance D1, which may be between about 0.1 μm and about 1 μm, for example. It is appreciated, however, that the values recited throughout the description are merely examples, and may be changed to different values.

Figure 3:
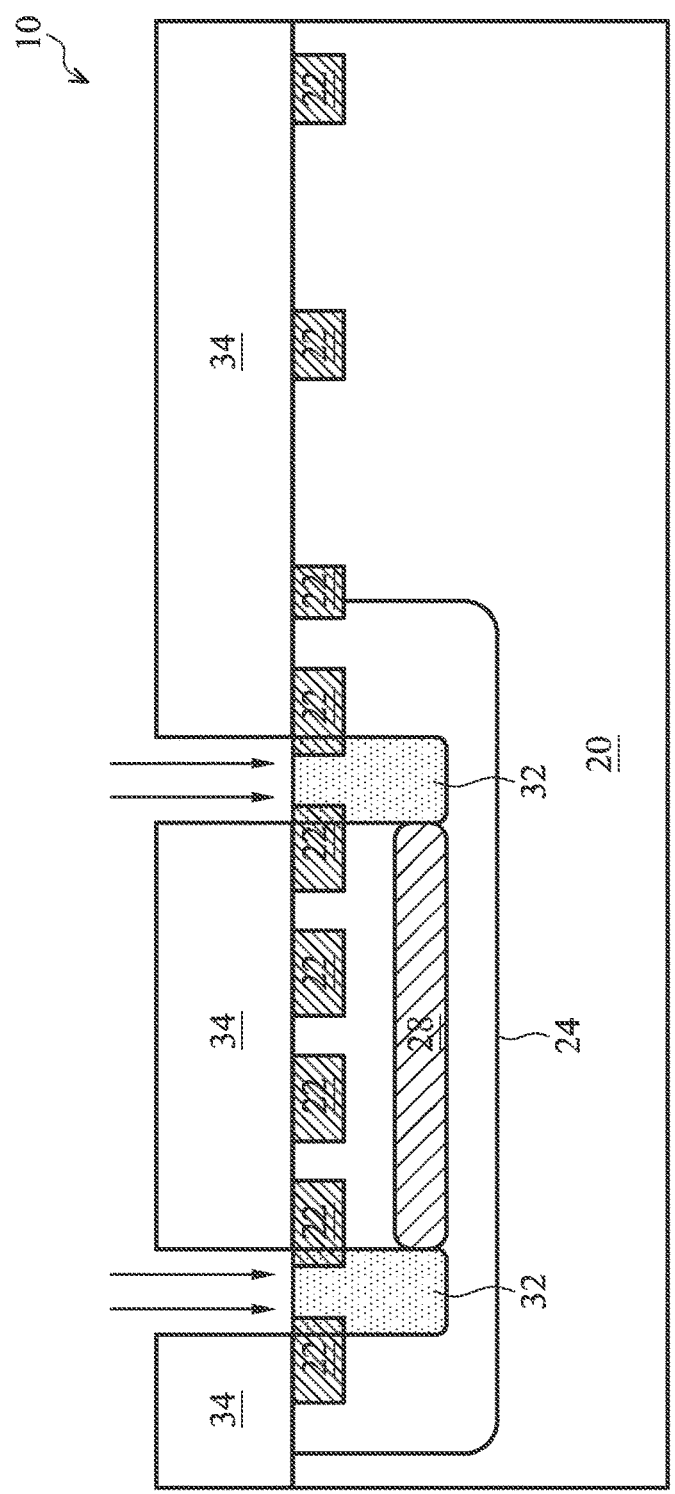

Next, as shown in FIG. 3, p-well regions 32 are formed through an implantation step, wherein photo resist 34 is used as an implantation mask. The energy of the implantation is controlled so that p-well regions 32 contact bottom gate 28. P-well regions 32 may extend from the top of substrate 20 into deep n-well region 24. Although p-well regions 32 are referred to in a plural form, when viewed in a top view of the structure in FIG. 3, the illustrated p-well regions 32 may be portions of a same continuous p-well region 32, which may form a full ring in the top view. In some embodiments, the ring of p-well region 32 and bottom gate 28 in combination isolate the n-type regions inside the ring from other portions of substrate 20 that are outside the ring and below bottom gate 28. P-well region 32 has a p-type impurity concentration similar to that of bottom gate 28 in some embodiments, although the p-type impurity concentration may also be greater than or less than that of bottom gate 28.

Figure 4:
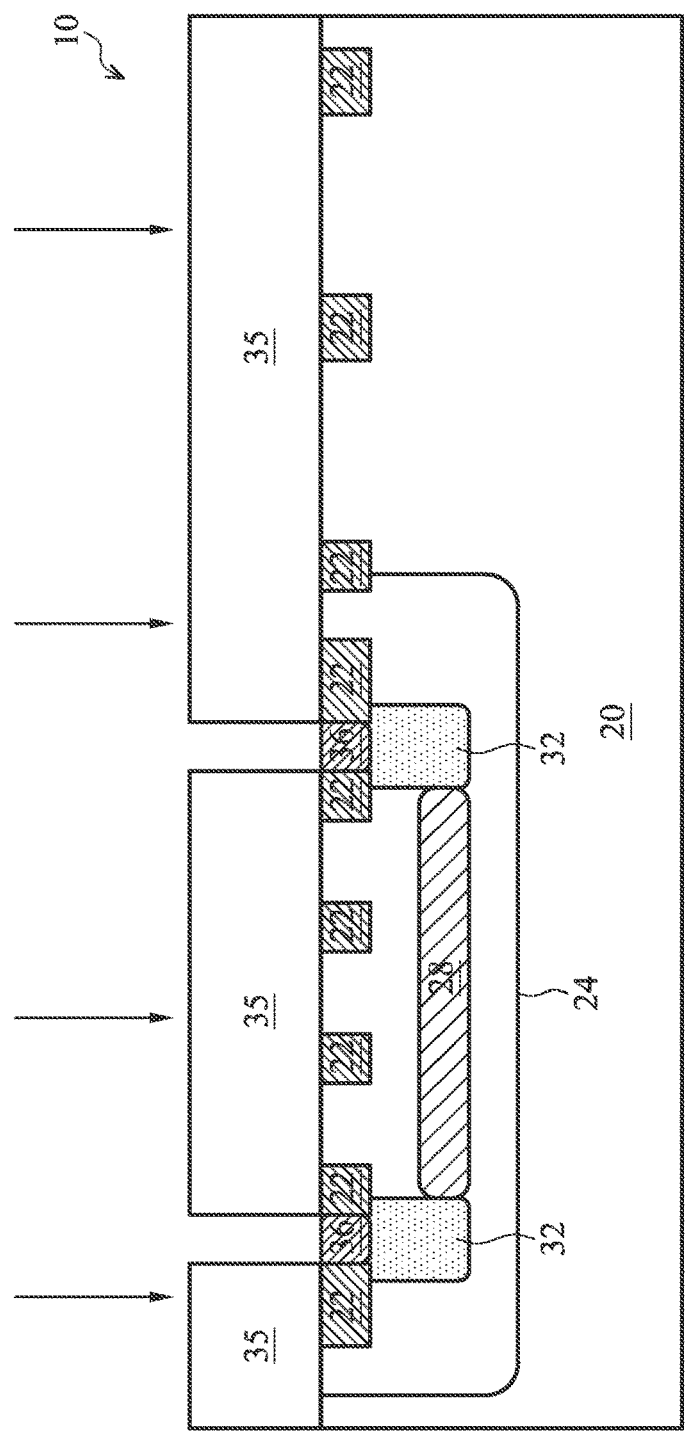

FIG. 4 illustrates the formation of p-type pickup regions 36, which may again be formed through an implantation step, wherein photo resist 35 is used as an implantation mask. P-type pickup regions 36 may also form a ring in the top view of the structure shown in FIG. 4. In some exemplary embodiments, p-type pickup regions 36 have a p-type impurity concentration between about $10^{19}/cm^3$ and about $10^{21}/cm^3$.

Figure 5:
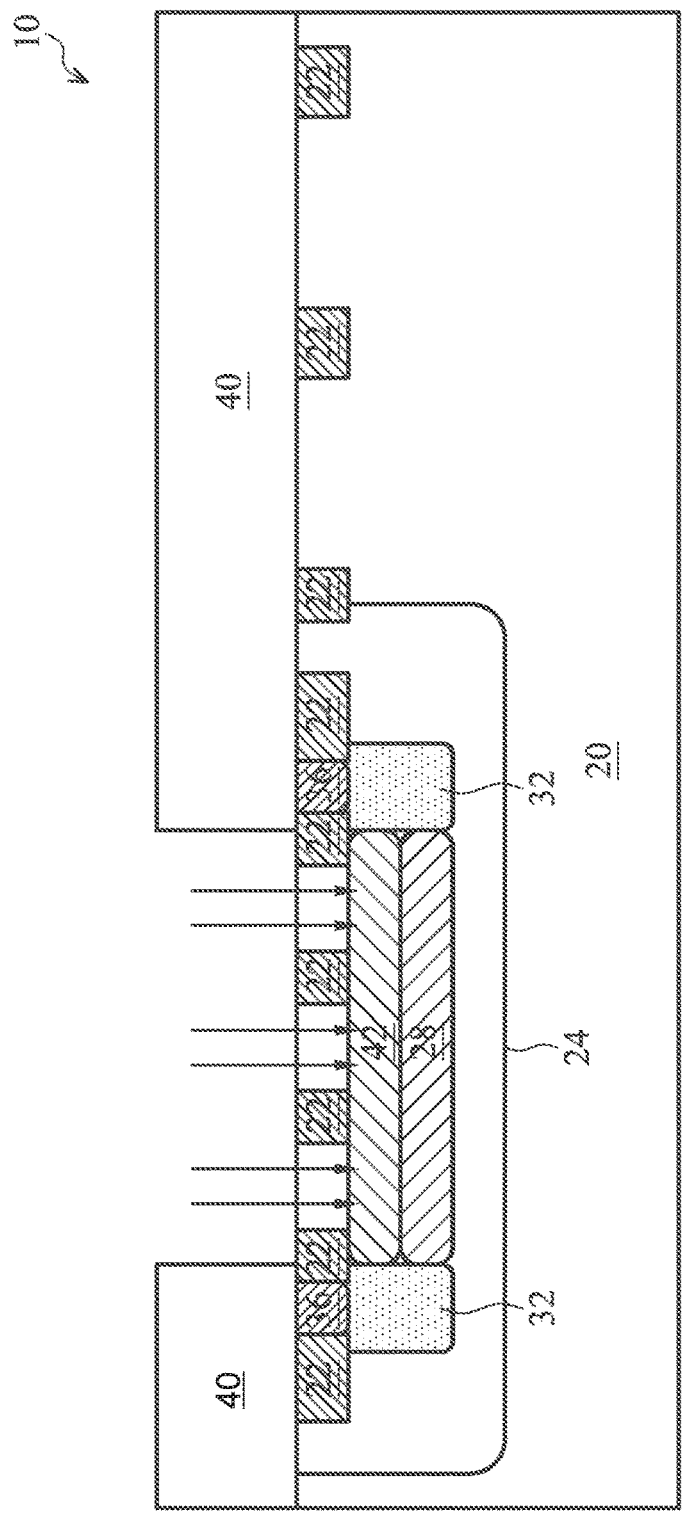

FIG. 5 illustrates the formation of channel region 42, which may be formed through implantation, wherein photo resist 40 may be used as an implantation mask. The formation of channel region 42 may be performed using a same lithography mask as for forming bottom gate 28. Accordingly, channel region 42 may overlap and be aligned to bottom gate 28. In the implantation step, additional n-type impurities are implanted to the region overlying bottom gate 28, and hence the impurity concentration of channel region 42 is adjusted to a desirable level, for example, between about $1E13/cm^3$ and about $1E14/cm^3$. Channel region 42 and the underlying bottom gate 28 form a p-n junction.

Figure 6:
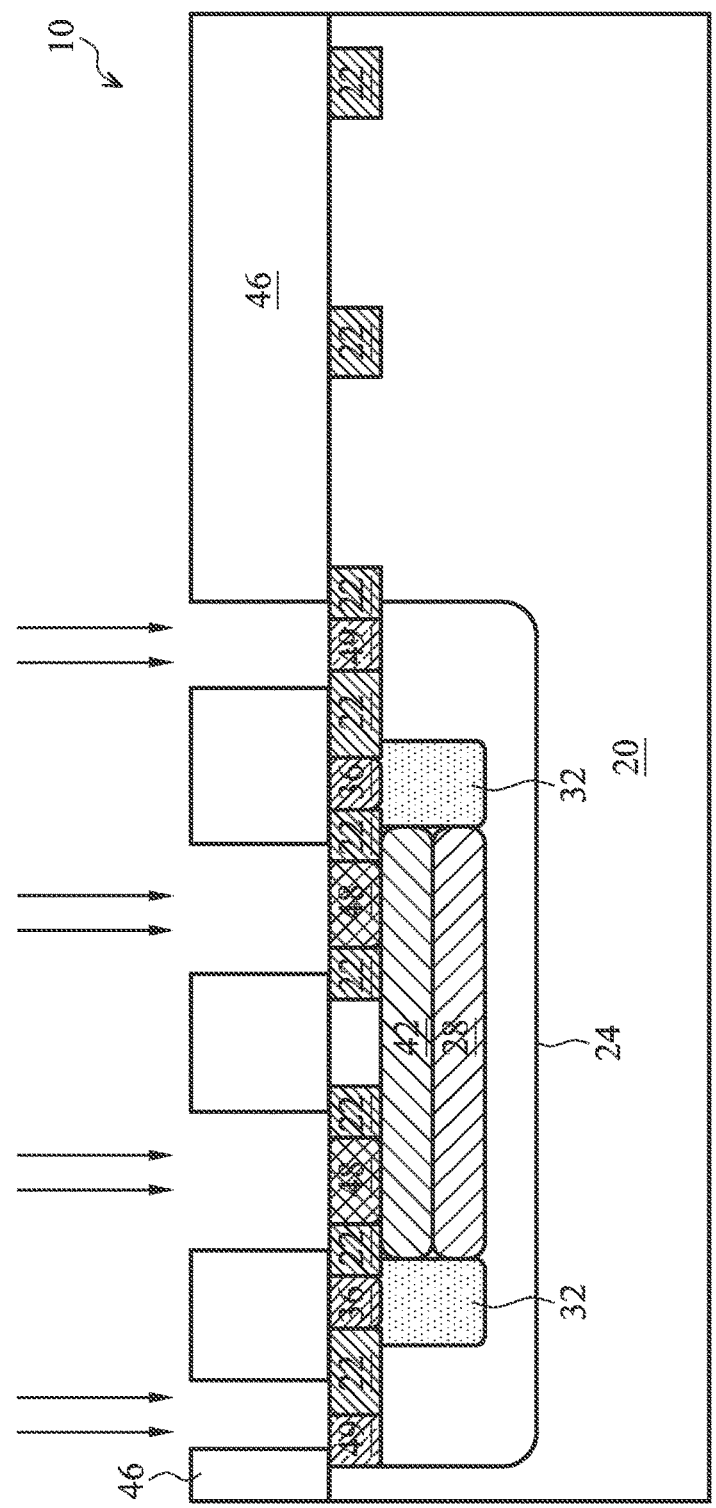

Referring to FIG. 6, n-type source/drain enhancement regions 48 (also referred to as source/drain regions) are formed through an implantation step, wherein photo resist 46 is formed as an implantation mask. N-type source/drain enhancement regions 48 may have an n-type impurity concentration between about $1E13/cm^3$ and about $1E15/cm^3$. In the meantime, deep n-well pickup regions 49 are also formed.

Figure 7:
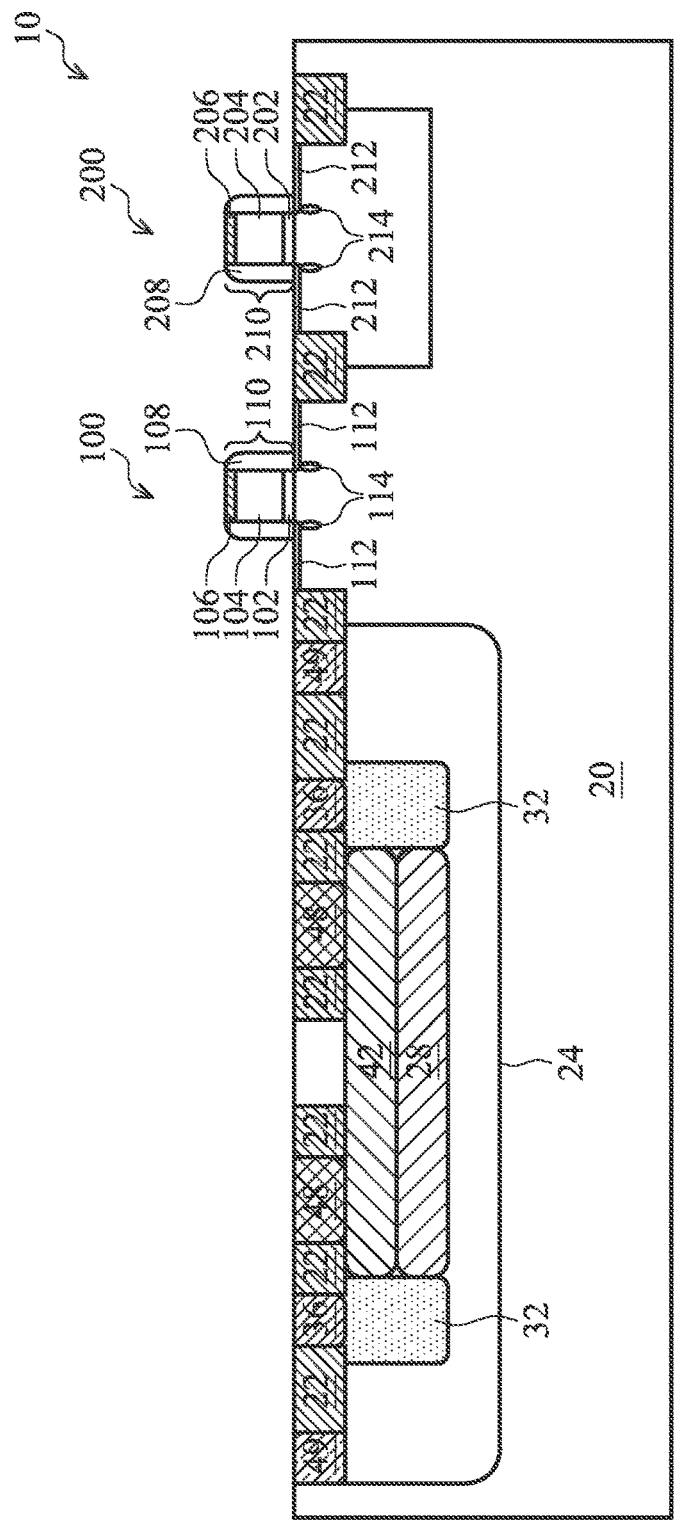

Next, as shown in FIG. 7, some components of N-type Metal-Oxide-Semiconductor (NMOS) device 100 and P-type Metal-Oxide-Semiconductor (PMOS) device 200 are formed. NMOS device 100 includes gate stack 110, which includes gate dielectric 102, gate electrode 104, hard mask layer 106, and gate spacers 108. Lightly Doped Drain/source (LDD) regions 112, which are of n-type, are also formed in substrate 20, for example, through an implantation. Halo/pocket regions 114, which are of p-type, may also be formed. PMOS device 200 includes gate stack 210, which includes gate dielectric 202, gate electrode 204, hard mask layer 206, and gate spacers 208. Lightly Doped Drain/source (LDD) regions 212, which are of p-type, are also formed in substrate 20, for example, through an implantation. Halo/pocket region 214, which are of n-type, may also be formed. In addition, well region 215 may be formed for PMOS device 200. The formation of gate dielectrics 102/202, gate electrodes 104/204, and hard mask layers 106/206 may include blanket depositing a gate dielectric layer, a gate electrode layer, and a hard mask layer, and then patterning the blanket layers.

In accordance with embodiments, the formation of n-type source/drain enhancement regions 48 (FIG. 6) and/or channel region 42 (FIG. 5) are performed before the formation of the MOS device components as in FIG. 7. Since the formation of MOS devices 100 and 200 includes a plurality of thermal processes such as anneals, the impurities in the n-type source/drain enhancement regions 48 and channel region 42 diffuse out during the thermal processes, and hence the impurities in n-type source/drain enhancement regions 48 may diffuse to the underlying regions. This may improve the connection between source/drain enhancement regions 48 and channel region 42, and result in a reduction in the respective resistance.

Figure 8:
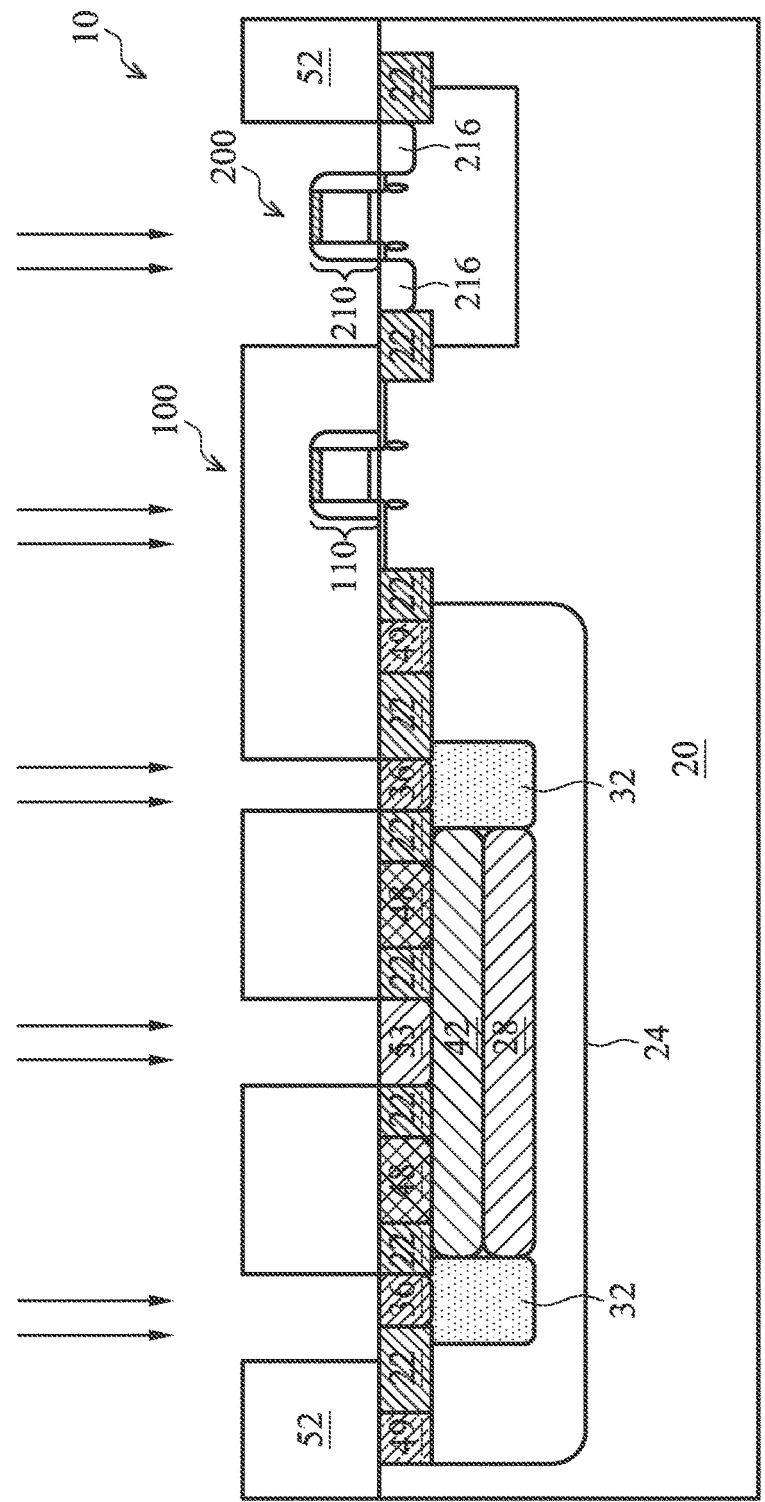

FIG. 8 illustrates the formation of source/drain regions 216 for PMOS device 200. Photo resist 52 is formed to mask the regions that are not to be implanted. During the formation of source/drain regions 216, p-type pickup regions 36 may be implanted again simultaneously to increase their impurity concentration. In alternative embodiments, p-type pickup regions 36 are not implanted when source/drain regions 216 are formed. Furthermore, a region overlying channel region 42 is implanted to form top gate 53, which is of p-type. Top gate 53 is in contact with channel region 42, and forms a p-n junction with channel region 42.

Figure 9:
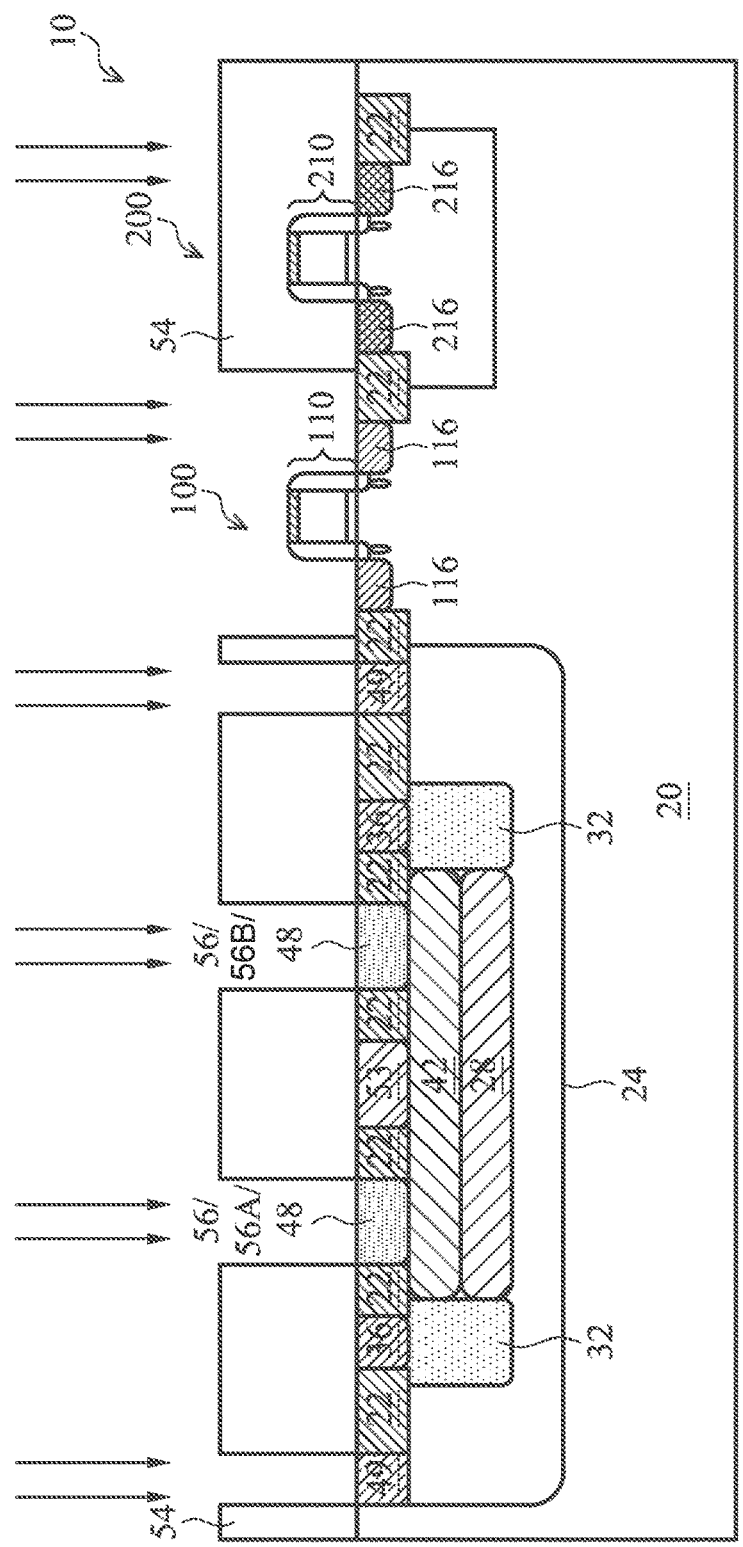

FIG. 9 illustrates the formation of source/drain regions 116 for NMOS device 100. Photo resist 54 is formed to mask the regions that are not to be implanted. During the formation of source/drain regions 116, source/drain enhancement regions 48 may be implanted again simultaneously to increase their impurity concentration. In alternative embodiments, source/drain enhancement regions 48 are not implanted when source/drain regions 116 are formed. In the resulting structure, the impurity concentration of source/drain enhancement regions 48 is further increased. Source/drain enhancement regions 48 are referred to hereinafter as source/drain regions 56, which include source region 56A and drain region 56B.

Figure 10:
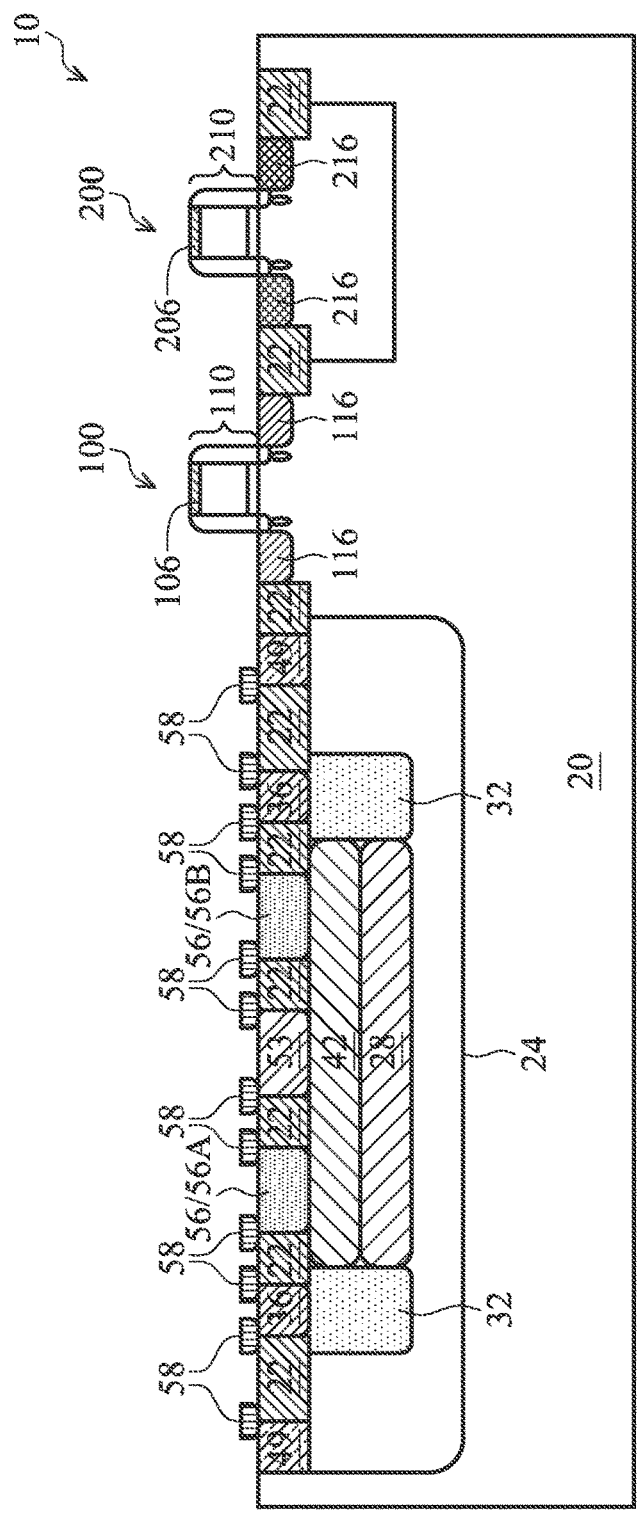

Next, as shown in FIG. 10, Resistive Protection Oxide (RPO) regions 58 are formed to cover the interfaces between doped regions 36, 49, 53, 56 and their respective neighboring STI regions 22. RPO regions 58 may protect the interface regions from the undesirable etch caused in the subsequent formation of contact plugs (not shown), and may help reduce the leakage currents occurring in the interface regions. In subsequent process steps, hard masks layers 106 and 206 (marked in FIG. 9) are removed. Additional regions such as silicide regions, contact plugs, Inter-Layer Dielectric (ILD), metal layers (note shown), and the like, are formed.

As shown in FIG. 10, source/drain regions 56 include source region 56A and drain region 56B, which have the same conductivity type as, and are electrically coupled to, channel region 42. Source region 56A and drain region 56B are further spaced apart from each other by top gate 53, which is of an opposite conductivity type than source/drain regions 56. Bottom gate 28 may be accessed through p-well pickup regions 36 and p-well regions 32. For example, a voltage may be applied to bottom gate 28 by applying the voltage to p-well pickup regions 36.

The structure shown in FIG. 10 may be used to form various integrated circuit devices such as Junction FET (JFET) devices, varactors, resistors, Bipolar Junction Transistors (BJTs), diodes, or the like. Since the formation processes of these devices share the same process steps, the manufacturing cost is reduced. FIGS. 11 through 15 illustrate some exemplary devices formed from the structure shown in FIG. 10. The formation of the devices in FIGS. 11 through 15 may all start from the structure shown in FIG. 10, except that the electrical connections, which may include contact plugs, metal lines, vias, and the like are different, so that the resulting devices are different, as shown in FIGS. 11 through 15. The electrical connections are symbolized by lines in FIGS. 11 through 15.

Figure 11:
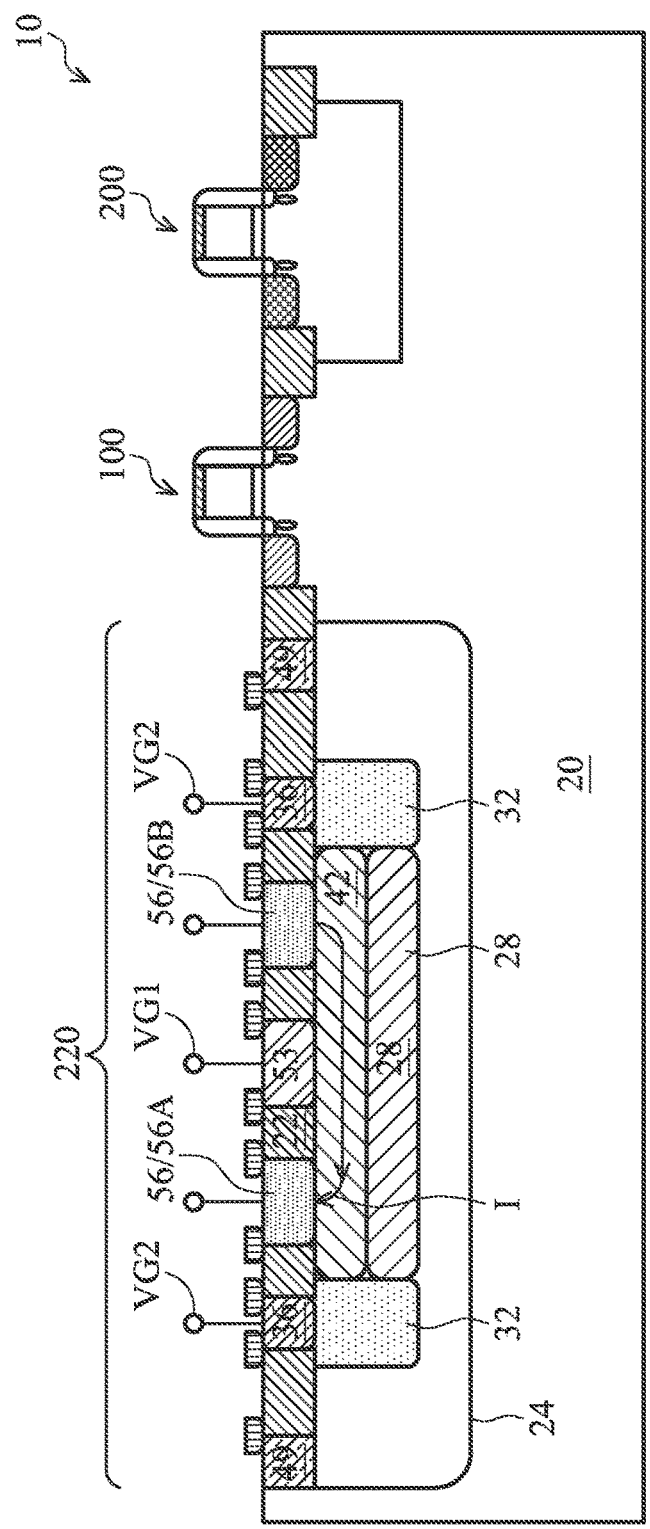
FIGS. 11 through 15 illustrate the cross-sectional views of various devices in accordance with exemplary embodiments.

Referring to FIG. 11, JFET 220 is formed, and includes source region 56A, drain region 56B, top gate 53, and bottom gate 28. Channel region 42 is controlled by top gate 53 and bottom gate 28. By adjusting voltages VG1 and VG2 that are applied on top gate 53 and bottom gate 28, respectively, the channel in channel region 42 may be turned on or pinched off by the depletion region formed between top gate and channel region 42, and the depletion region formed between bottom gate 28 and channel region 42. The current I flowing through the channel is illustrated. Although not shown, a voltage source may be connected to top gate 53 and bottom gate 28 in order to provide voltages VG1 and VG2.

Figure 12:
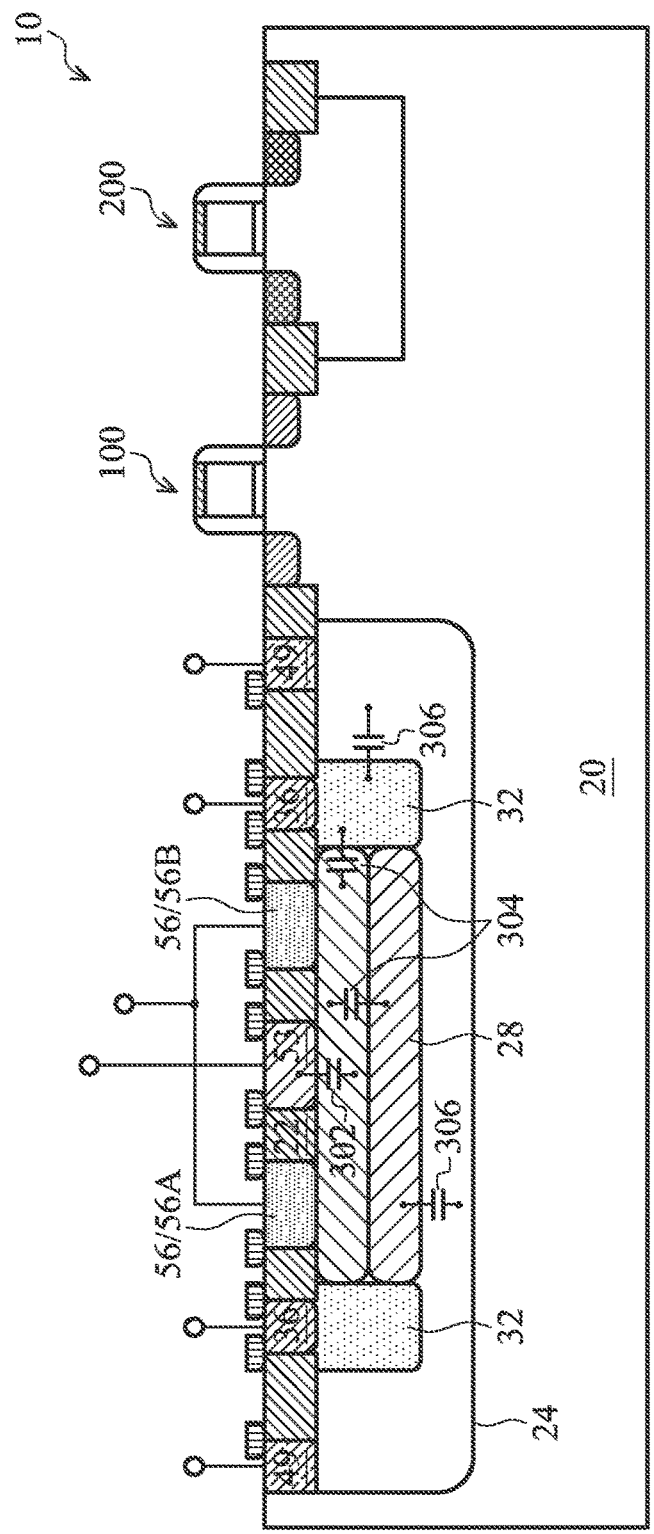

Referring to FIG. 12, varactors 302, 304, and 306 are formed. For example, source region 56A and drain region 56B may be shorted. Accordingly, varactor 302 is formed between top gate 53 and channel region 42, wherein source/drain regions 56 and channel region 42 are used as a capacitor electrode, and top gate 53 acts as another capacitor electrode. Varactors 304 are formed between bottom gate 28/p well regions 32 and channel region 42, wherein source/drain regions 56 and channel region 42 are used as a capacitor electrode, and bottom gate 28 or p well regions 32 forms another capacitor electrode. Furthermore, bottom gate 28/p well regions 32 may also form varactors 306 with deep n-well region 24, wherein pickup regions 49 are used to access varactors 306.

Figure 13:
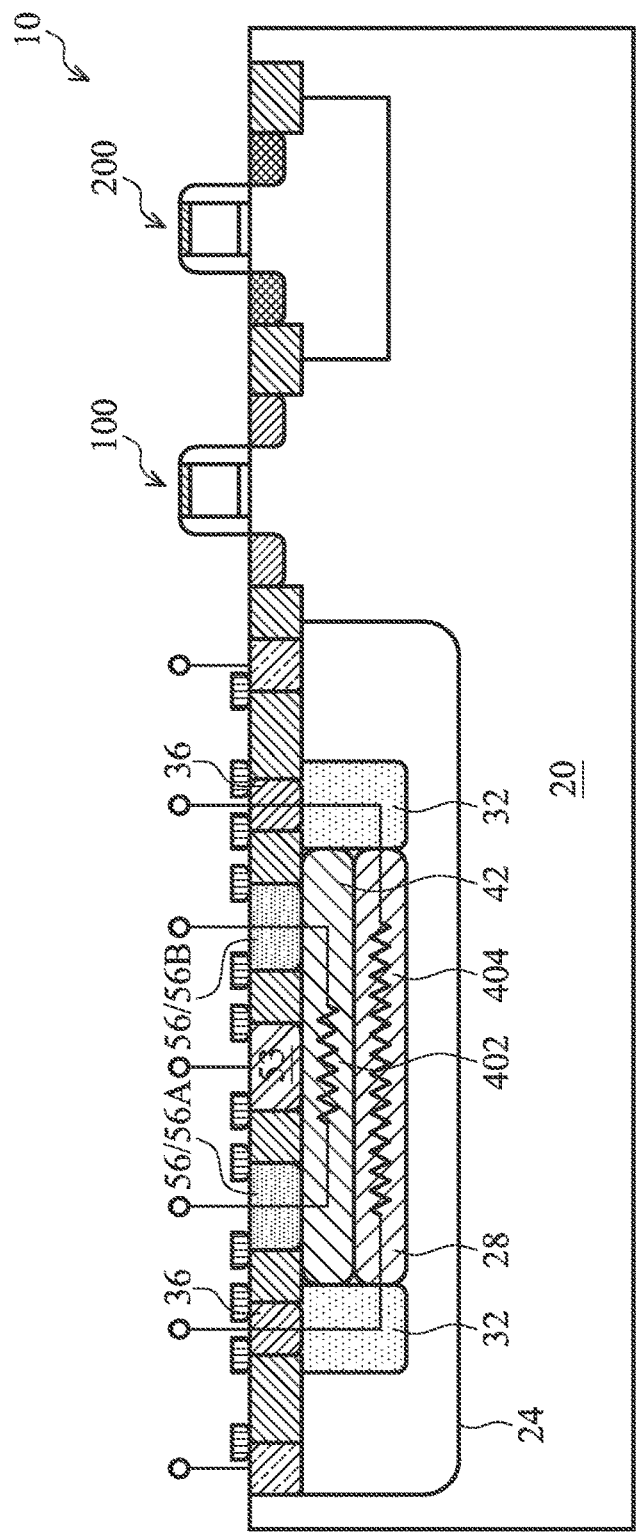

In FIG. 13, resistors 402 and/or 404 may be formed. For example, channel region 42 forms resistor 402, which is coupled between source region 56A and drain region 56B. Furthermore, bottom gate 28 may form resistor 404, which is coupled between two separated p-well pickup regions 36. In these embodiments, however, p-well regions 32 that are connected to opposite ends of resistor 404 are separate p-well regions rather than a p-well ring. Furthermore, p-well pickup regions 36 that are connected to opposite ends of resistor 404 are also separate p-well regions rather than a p-well ring.

Figure 14:
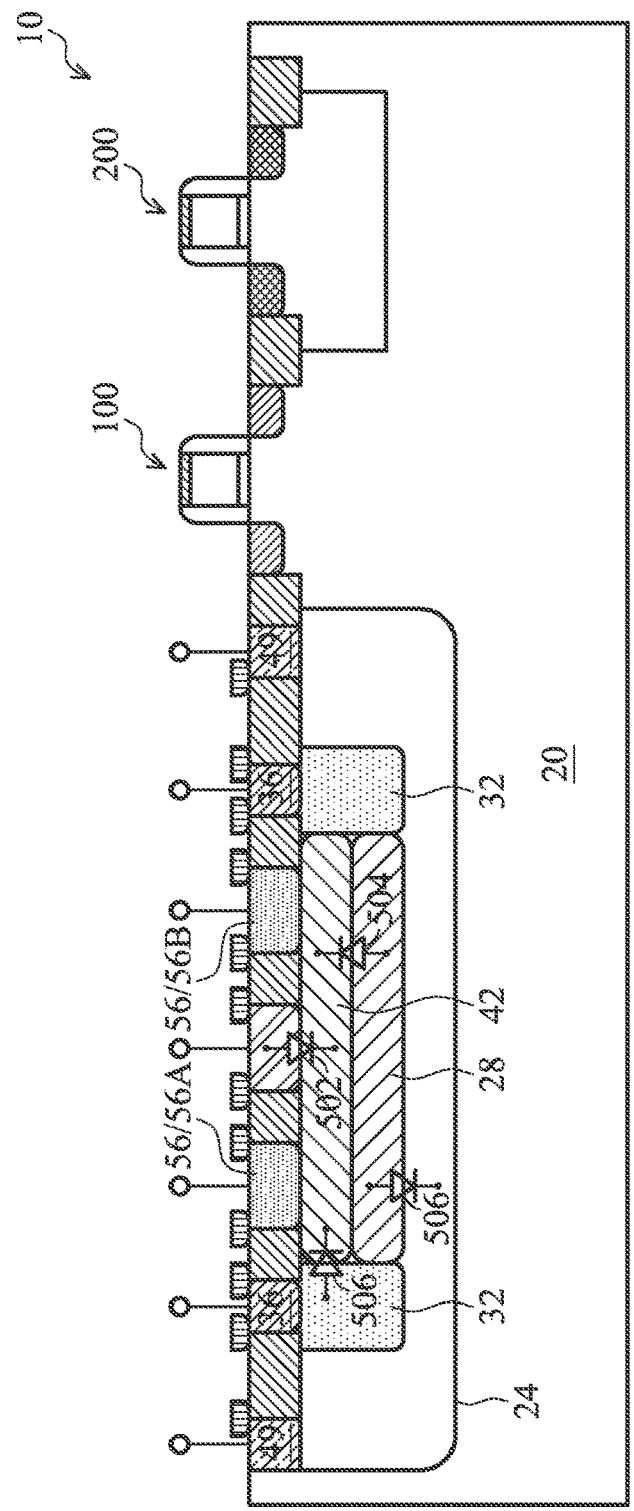

In FIG. 14, diodes 502, 504, and 506 are formed. Diode 502 is formed between top gate 53 and channel region 42, wherein source/drain regions 56 may be used as the cathode pickup. Diode 504 is formed between bottom gate 28 and channel region 42, wherein source/drain regions 56 are used as the cathode pickup, and p-well pickup regions 36 are used as the anode pickup. Diode 506 is formed between bottom gate 28 and deep n-well region 24, wherein p-well pickup regions 36 may be used as the anode pickup, and deep n-well pickup regions 49 may be used as the cathode pickup.

Figure 15:
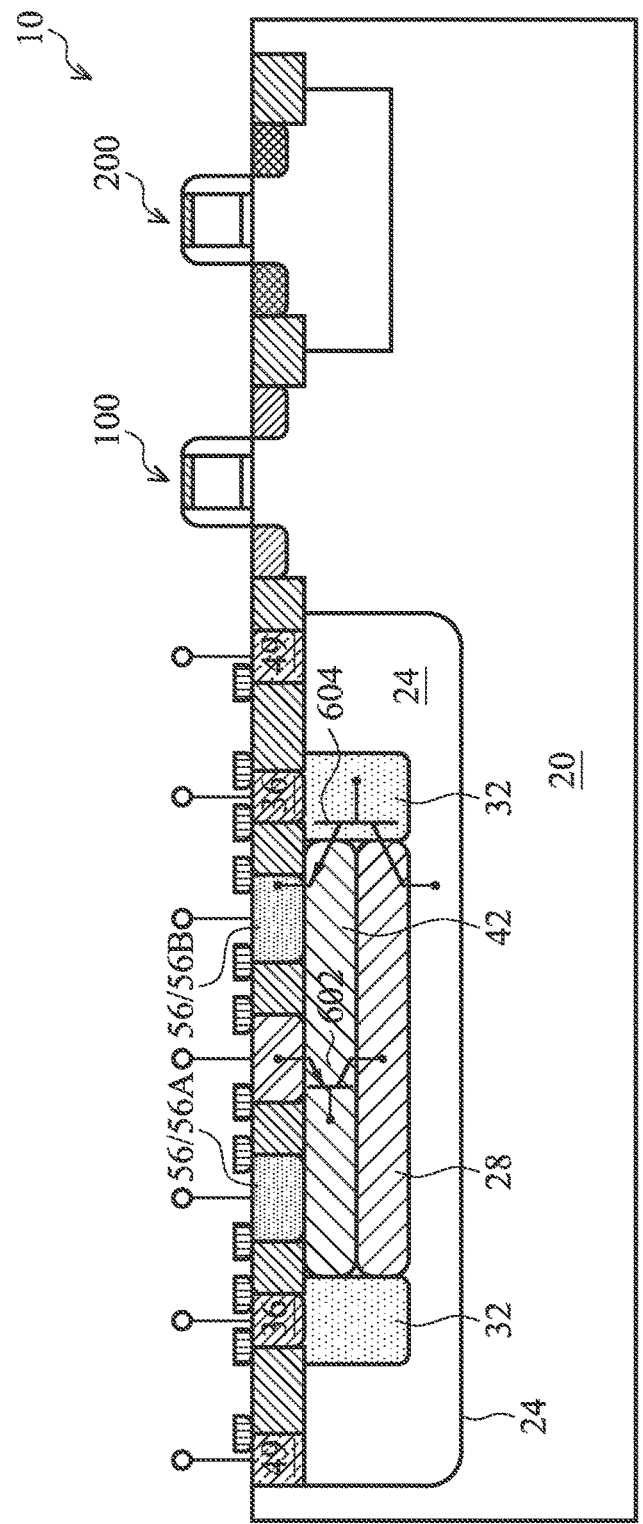

In FIG. 15, PNP BJT 602 is formed, wherein channel region 42 is the base, and source/drain regions 56 are base pickup regions. One of top gate 53 and bottom gate 28 is the emitter of PNP BJT 602, and the other is the collector. NPN BJT 604 is also formed, wherein p-well regions 32 and bottom gate 28 are the base. Source/drain regions 56 act as one of the emitter and collector, and deep n-well region 24 act as the other one of the emitter and collector.

FIGS. 16 through 23 are exemplary layouts of the integrate circuit structures shown in FIGS. 10 through 15. It is appreciated that there are more varieties as how the integrate circuit structures may be laid out, and these varieties are also in the scope of various embodiments. In FIGS. 16 through 23, channel region 42 and bottom gate 28 are marked using dashed lines.

Figure 17:
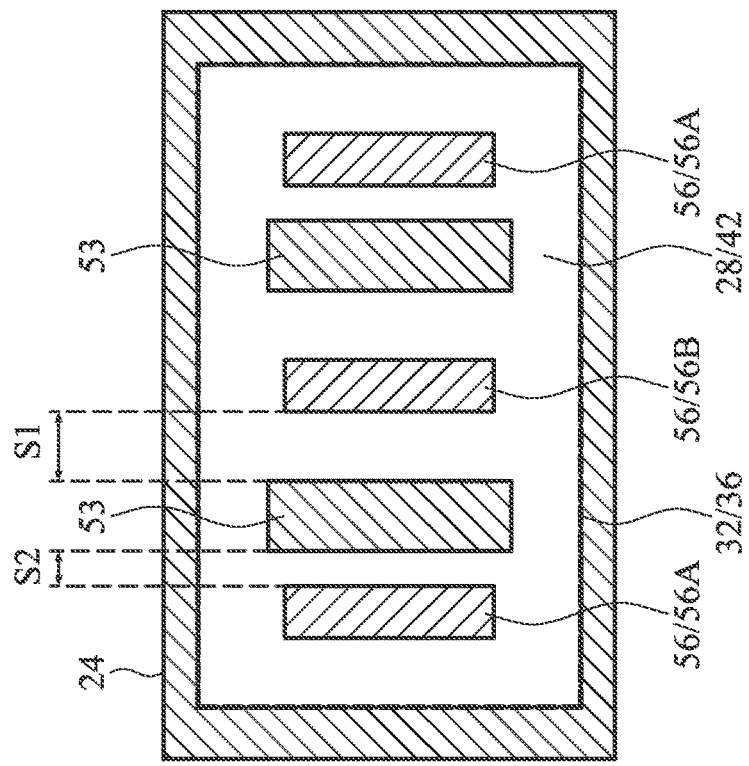
Figure 16:
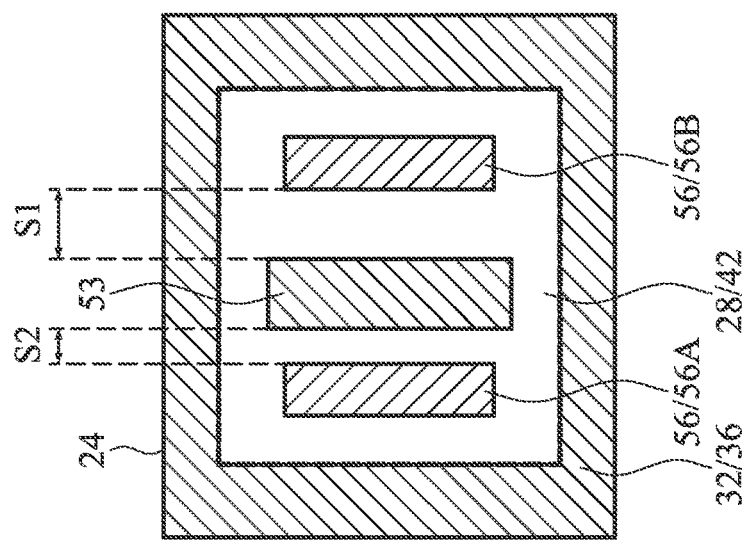

Referring to FIGS. 16 and 17, asymmetric layouts are illustrated, with the spacing S1 between drain region 56B and top gate 53 different from spacing S2 between source region 56A and top gate 53. Top gate 53 is disconnected from p-well pickup region 36, and hence is disconnected from bottom gate 28, although top gate 53 may also be connected to p-well pickup region 36 in alternative embodiments, similar to FIGS. 18 and 19. In FIG. 16, one top gate 53, one source region 56A, and one drain region 56B are formed. In FIG. 17, two top gates 53, two source regions 56A, and one drain region 56B are formed.

Figure 19:
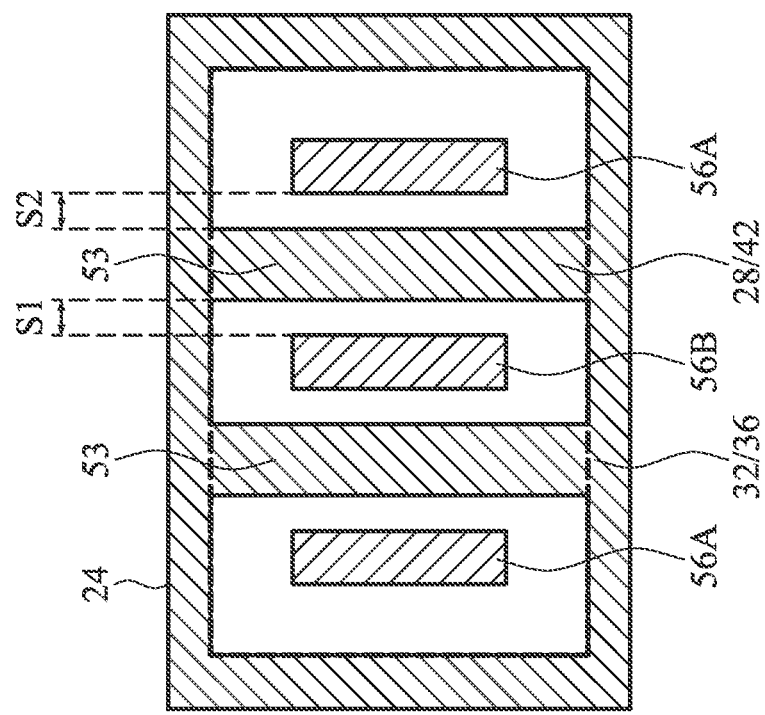
Figure 18:
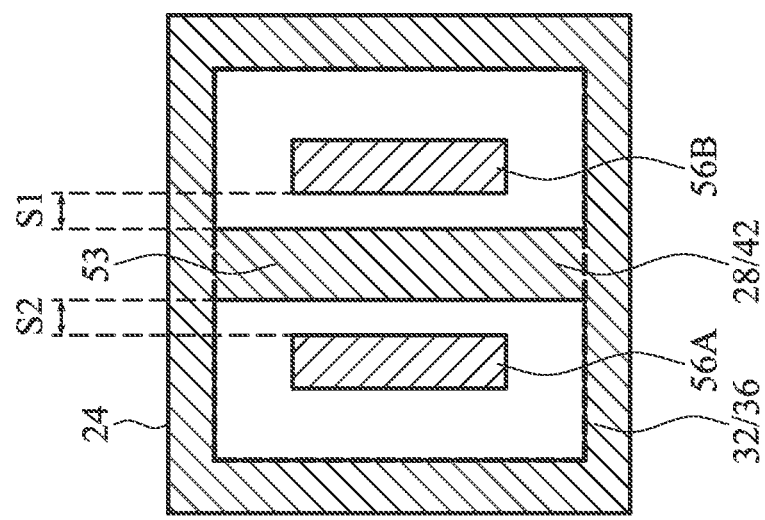

Referring to FIGS. 18 and 19, symmetric layouts are illustrated, with the spacing S1 between drain region 56B and top gate 53 substantially equal to spacing S2 between source region 56A and top gate 53. Top gate 53 is connected to p-well pickup region 36 in these embodiments, and hence is connected to bottom gate 28, although top gate 53 may also be disconnected from p-well pickup region 36 in alternative embodiments, similar to FIGS. 16 and 17. In FIG. 18, one top gate 53, one source region 56A, and one drain region 56B are formed. In FIG. 19, two top gates 53, two source regions 56A, and one drain region 56B are formed.

Figure 21:
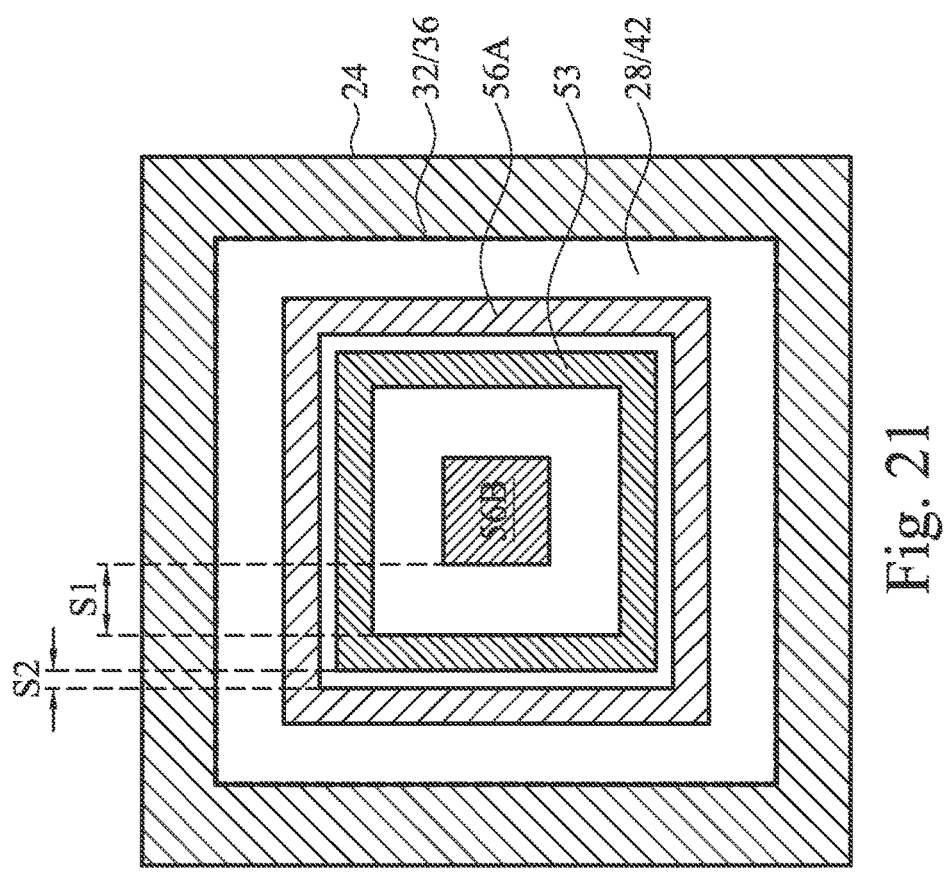
Figure 22:
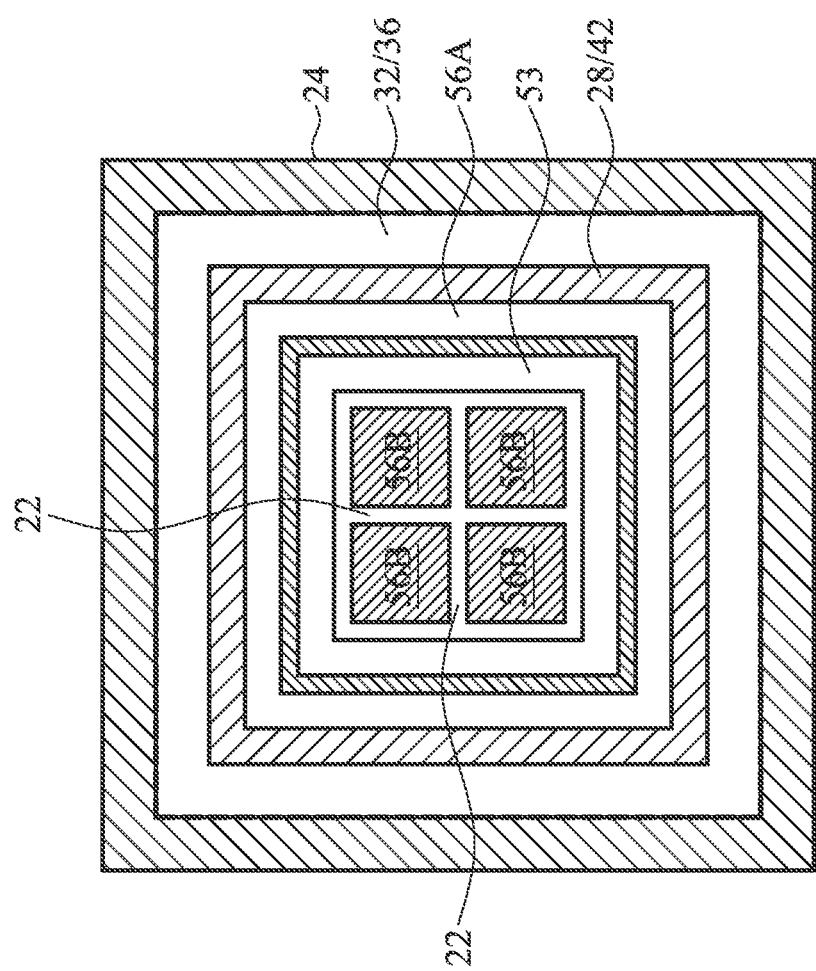
Figure 23:
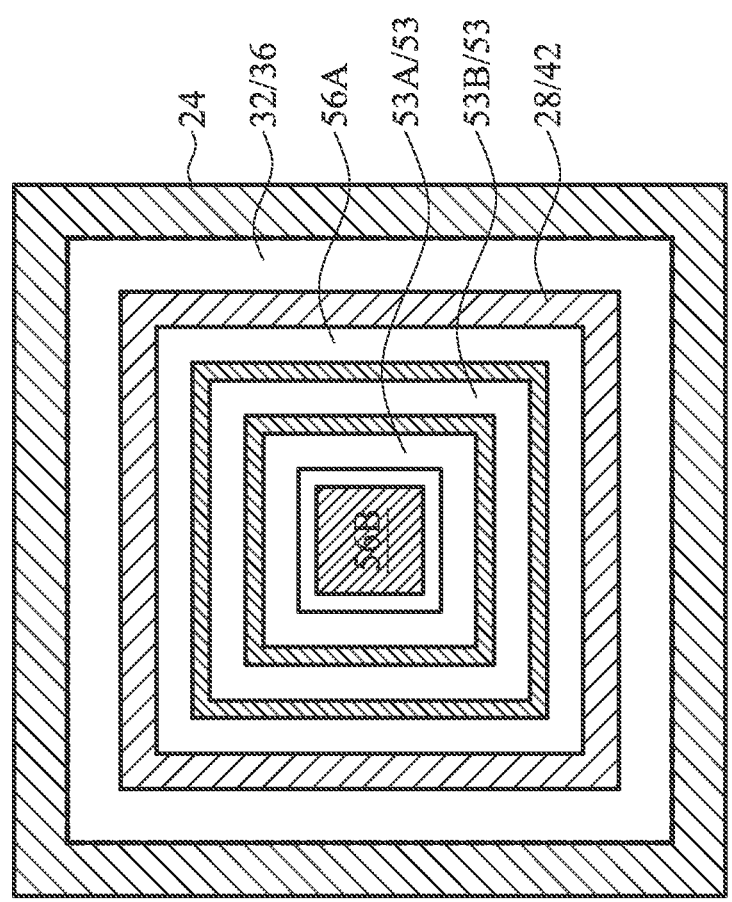

In FIGS. 20 through 23, each of top gate 53, source region 56A, and p-well pickup region 36 forms a ring encircling drain region 56B, with the outer rings encircling the inner rings. FIG. 20 illustrates a symmetric structure, with the spacing S1 between drain region 56B and top gate 53 substantially equal to spacing S2 between source region 56A and top gate 53. FIG. 21 illustrates an asymmetric structure, with the spacing S1 between drain region 56B and top gate 53 different from spacing S2 between source region 56A and top gate 53. FIG. 22 illustrates a plurality of drain regions 56B that are spaced apart from each other, for example, by STI regions 22. The plurality of drain regions 56B may be interconnected as a single drain region, or disconnected from each other in order to be connected to different voltages and nodes. FIG. 23 illustrates a dual gate structure, wherein there are two top gates 53A and 53B, which may be applied with different voltages and/or connected to different nodes. Both top gates 53A and 53B may affect the operation of the respective integrated circuit structure.

In accordance with embodiments, a method includes forming a deep well region of a first conductivity type in a substrate, implanting a portion of the deep well region to form a first gate, and implanting the deep well region to form a well region. The well region and the first gate are of a second conductivity type opposite the first conductivity type. The deep well region includes a portion connected to an end of the first gate. An implantation is performed to form a channel region over the first gate, wherein the channel region is of the first conductivity type. A portion of the deep well region overlying the channel region is implanted to form a second gate of the second conductivity type. A source/drain implantation is performed to form a source region and a drain region on opposite sides of the second gate. The source and drain regions are of the first conductivity type, and are connected to the channel region. The source region and the drain region overlap the channel region and the first gate.

In accordance with other embodiments, a method includes forming a deep well region of a first conductivity type in a substrate, implanting an intermediate portion of the deep well region to form a bottom gate, and implanting the deep well region to form a well ring extending from a top surface of the substrate to the bottom gate. The well ring and the bottom gate are of a second conductivity type opposite the first conductivity type. The well ring encircles the bottom gate. A portion of the deep well region overlying and contacting the bottom gate is implanted to form a channel region of the first conductivity type. A portion of the deep well region overlying the channel region is implanted to form a top gate of the second conductivity type. A source/drain implantation is performed to form a first source region and a first drain region on opposite sides of the top gate, wherein the first source and drain regions are of the first conductivity type, and are connected to the channel region. The first source region and the first drain region overlap the channel region and the bottom gate. After the first source/drain implantation, a gate stack of a MOS device is formed over the substrate. After forming the gate stack, a second source/drain implantation is performed to form second source and drain regions for the MOS device.

In accordance with yet other embodiments, a device includes a deep well region of a first conductivity type in a substrate, a bottom gate in the deep well region, and a well region extending from a top surface of the substrate to the bottom gate. The well region and the bottom gate are of a second conductivity type opposite the first conductivity type. A channel region of the first conductivity is disposed overlying and contacting the bottom gate. A top gate of the second conductivity type is disposed overlying the channel region and forming a p-n junction with the channel region. A source region and a drain region are on opposite sides of the top gate. The source and drain regions are of the first conductivity type, and are connected to the channel region. The source region and the drain region overlap the channel region and the bottom gate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming Shallow Trench Isolation (STI) regions in a substrate;
forming a deep well region of a first conductivity type in the substrate by implanting impurities into the substrate, wherein the deep well region extends to a top-most surface of the substrate;
implanting a portion of the deep well region to form a first gate;
implanting the deep well region to form a well region, wherein the well region and the first gate are of a second conductivity type opposite the first conductivity type, and wherein the deep well region comprises a portion connected to an end of the first gate, and wherein the well region forms a ring encircling the first gate in a plan view;
performing an implantation to form a channel region over the first gate, wherein the channel region is of the first conductivity type;
implanting a portion of the deep well region overlying the channel region to form a second gate of the second conductivity type, wherein the second gate extends to the top-most surface of the substrate, wherein an interface between the channel region and the second gate is substantially coplanar with a bottom surface of an STI region of the STI regions extending from a top surface of the substrate into the substrate, the STI region having an edge contacting the second gate;
performing a first source/drain implantation to form a first source region and a first drain region on opposite sides of the second gate, wherein the first source and drain regions are of the first conductivity type, and are connected to the channel region, and wherein the first source region and the first drain region overlap the channel region and the first gate;
after the first source/drain implantation, forming a gate stack for a Metal-Oxide-Semiconductor (MOS) device over the substrate; and
after forming the gate stack, performing a second source/drain implantation to form second source/drain regions for the MOS device, wherein the first source and drain regions are further implanted during the second source/drain implantation.

2. The method of claim 1 further comprising forming electrical connections coupled to the second gate, the well region, the first source region, the first drain region, and the second gate to form a Junction Field Effect Transistor (JFET).

3. The method of claim 1, wherein the second gate and the first source region have a first distance, and the second gate and the first drain region have a second distance different from the first distance.

4. The method of claim 1 further comprising:
a plurality of isolation regions extending into the substrate, wherein the plurality of isolation regions separates the first source region, the first drain region, and the second gate from each other, wherein each of the first source region, the first drain region, and the second gate has all of edges in contact with edges of the isolation regions; and
a resistive protection oxide comprising a plurality of portions covering a first interface between the first source region and a first one of the plurality of isolation regions, a second interface between the first drain region and a second one of the plurality of isolation regions, and a third interface between the second gate and a third one of the plurality of isolation regions.

5. The method of claim 1, wherein the second gate, the first source region, and the first drain region form three elongated strips that have lengthwise directions parallel with each other, and the second gate extends beyond respective opposite edges of the first source region and the first drain region in the lengthwise directions, wherein respective opposite edges form respective interfaces with respective STI regions.

6. The method of claim 1, further comprising forming another MOS device, wherein source/drain regions of the another MOS device are implanted simultaneously as forming the second gate.

7. The method of claim 1 further comprising, after implanting the deep well region to for a well region and before performing an implantation to form a channel region over the first gate, forming pickup regions by implanting the well region.

8. A method comprising:
forming a deep well region of a first conductivity type in a substrate, wherein the deep well region extends to a top-most surface of the substrate;
implanting a portion of the deep well region to form a bottom gate;
implanting the deep well region to form a well ring extending from a top surface of the substrate to the bottom gate, wherein the well ring and the bottom gate are of a second conductivity type opposite the first conductivity type, and wherein the well ring encircles the bottom gate;
implanting a portion of the deep well region overlying and contacting the bottom gate to form a channel region of the first conductivity type;
implanting a portion of the deep well region overlying the channel region to form a top gate of the second conductivity type, wherein an interface between the channel region and the top gate is substantially coplanar with a bottom surface of an isolation region extending from a top surface of the substrate into the substrate, and the isolation region has an edge contacting the top gate; and
performing a first source/drain implantation to form a first source region and a first drain region on opposite sides of the top gate, wherein the first source and drain regions are of the first conductivity type, and are connected to the channel region, and wherein the first source region and the first drain region overlap the channel region and the bottom gate;
after the first source/drain implantation, forming a gate stack of a Metal-Oxide-Semiconductor (MOS) device over the substrate; and
after forming the gate stack, performing a second source/drain implantation to form second source and drain regions of the MOS device.

9. The method of claim 8, wherein the top gate and the first source region have a first distance, and the top gate and the first drain region have a second distance different from the first distance.

10. The method of claim 8 further comprising forming electrical connections to connect the bottom gate, the top gate, the first source region, and the first drain region as a Junction Field Effect Transistor (JFET), with the channel region being a channel of the JFET.

11. The method of claim 8 further comprising, after the first source/drain implantation and before the second source/drain implantation, forming a lightly doped source/drain region for the MOS device.

12. The method of claim 8, wherein the first source and drain regions are further implanted during the second source/drain implantation.

13. The method of claim 8 further comprising, after the first source/drain implantation and before the second source/drain implantation, forming halo/pocket regions for the MOS device.

14. A method comprising:
  forming a deep well region of a first conductivity type in a semiconductor substrate by implanting impurities into the semiconductor substrate, wherein the deep well region extends to a top-most surface of the semiconductor substrate;
  forming Shallow Trench Isolation (STI) regions in the semiconductor substrate;
  forming a channel region in the semiconductor substrate, wherein the channel region is of a first conductivity type;
  implanting the deep well region to form a first gate overlying and contacting the channel region, wherein the first gate extends to the top-most surface of the semiconductor substrate;
  forming a Metal-Oxide-Semiconductor (MOS) device, wherein source/drain regions of the MOS device are implanted while implanting the deep well region to form the first gate;
  implanting the deep well region to form a second gate underlying and contacting the channel region, wherein the first gate and the second gate are of a second conductivity type opposite the first conductivity type, wherein an interface between the channel region and the second gate is substantially coplanar with a bottom surface of an STI region of the STI regions extending from a top surface of the semiconductor substrate into the semiconductor substrate, the STI region having an edge contacting the second gate;
  implanting the deep well region to form a first source/drain region and a second source/drain region over and contacting the channel region, wherein the first and the second source/drain regions are on opposite sides of the first gate, and are of the first conductivity type, and the first gate and the first source/drain region have a first distance, and the first gate and the second source/drain region have a second distance different from the first distance
  forming a gate stack for a second MOS device over the semiconductor substrate; and
  performing a source/drain implantation to form additional source/drain regions for the second MOS device, wherein the first and the second source/drain regions are further implanted during the source/drain implantation.

15. The method of claim 14, wherein the first source/drain region and the second source/drain region overlap the channel region and the second gate.

16. The method of claim 14 further comprising forming electrical connections coupled to the second gate, the first source/drain region, the second source/drain region, and the second gate to form a Junction Field Effect Transistor (JFET).

17. The method of claim 14, wherein the first conductivity type is p-type.

18. The method of claim 14, wherein the first conductivity type is n-type.

19. The method of claim 14, further comprising forming a well ring of the second conductivity type, the well ring encircling the second gate in a plan view.

20. The method of claim 14 further comprising forming halo/pocket regions for the first and second MOS devices.

* * * * *